United States Patent
Lahreche

(10) Patent No.: US 7,968,390 B2
(45) Date of Patent: Jun. 28, 2011

(54) ELECTRONIC DEVICES WITH IMPROVED OHMIC CONTACT

(75) Inventor: Hacène Lahreche, Paris (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 25 days.

(21) Appl. No.: 12/564,119

(22) Filed: Sep. 22, 2009

(65) Prior Publication Data

US 2010/0038682 A1 Feb. 18, 2010

Related U.S. Application Data

(63) Continuation of application No. PCT/IB2008/000788, filed on Mar. 25, 2008.

(51) Int. Cl.
H01L 21/338 (2006.01)
H01L 21/00 (2006.01)

(52) U.S. Cl. .................. 438/167; 438/47; 438/172

(58) Field of Classification Search ............... 438/167, 438/47, 172
See application file for complete search history.

(56) References Cited

U.S. PATENT DOCUMENTS

| | | | |
|---|---|---|---|
| 4,186,410 A | 1/1980 | Cho et al. | |
| 5,646,069 A | 7/1997 | Jelloian et al. | |
| 5,818,078 A * | 10/1998 | Makiyama et al. | 257/281 |
| 5,949,096 A * | 9/1999 | Ohkubo et al. | 257/192 |
| 6,121,153 A | 9/2000 | Kikkawa | |
| 6,686,616 B1 * | 2/2004 | Allen et al. | 257/280 |
| 7,419,892 B2 * | 9/2008 | Sheppard et al. | 438/522 |
| 7,432,142 B2 * | 10/2008 | Saxler et al. | 438/167 |
| 7,601,993 B2 * | 10/2009 | Hoshi et al. | 257/192 |
| 2002/0020856 A1 | 2/2002 | Nido et al. | |

FOREIGN PATENT DOCUMENTS

FR 2620270 A1 3/1989
WO WO-2006033167 A1 3/2006

OTHER PUBLICATIONS

SG-2009052408-Written Opinion, Oct. 22, 2010, Picogiga International (FR).

* cited by examiner

*Primary Examiner* — Luan C Thai
(74) *Attorney, Agent, or Firm* — Edwards Angell Palmer & Dodge LLP

(57) ABSTRACT

In one embodiment, the disclosure relates to an electronic device successively comprising from its base to its surface: (a) a support layer, (b) a channel layer adapted to contain an electron gas, (c) a barrier layer and (d) at least one ohmic contact electrode formed by a superposition of metallic layers, a first layer of which is in contact with the barrier layer. The device is remarkable in that the barrier layer includes a contact region under the ohmic contact electrode(s). The contact region includes at least one metal selected from the metals forming the superposition of metallic layers. Furthermore, a local alloying binds the contact region and the first layer of the electrode(s).

9 Claims, 5 Drawing Sheets

ELECTRONIC DEVICES WITH IMPROVED OHMIC CONTACT

CROSS-REFERENCE TO RELATED APPLICATIONS

This patent application is a continuation of and claims priority to International Application No. PCT/IB2008/000788, filed Mar. 25, 2008, which in turn claims priority to French Patent Application No. 0754186, filed on Mar. 30, 2007. Each of the aforementioned patent applications in incorporated by reference herein in its entirety.

BACKGROUND

1. Field of the Invention

The present invention relates to an electronic device comprising at least one support layer, a channel layer to contain an electron gas, a barrier layer and an ohmic contact electrode formed by a superposition of metallic layers the first of which is in contact with the barrier layer.

2. Description of Related Art

Electronic devices comprising at least one channel layer where an electron gas is able to flow, a barrier layer, and at least one ohmic contact electrode, find numerous applications.

Among these devices, field effect transistors of the High Electron Mobility Transistor (HEMT) type, or rectifiers are for example to be found. A HEMT presents two ohmic contact electrodes (called "source" and "drain") and a Schottky contact electrode (called "gate"), whereas a rectifier comprises one ohmic contact electrode and one Schottky contact electrode.

Structures whose base is formed by group III/N materials are widely used in these applications, on account of their large bandgap.

The general structure of these devices will be described with reference to FIG. 1 which represents an example of a HEMT of known type. This description can apply to a rectifier considering the left-hand part of FIG. 1 only.

Such a device comprises a support layer 1 at its base, the role of which layer is essentially to provide the rigidity of the device. This support layer 1 is covered by a channel layer 3.

Optionally, a buffer layer 2 is placed between support layer 1 and channel layer 3. This buffer layer 2 presents a good crystallographic quality and suitable properties for growth by epitaxy of the other layers which cover it. It therefore ensures the crystallographic transition between support layer 1 and channel layer 3. The buffer layer further ensures that the voltage of the device is maintained. In the case of a transistor, the buffer layer is electrically insulating, as it has to improve confinement of the electrons in channel layer 3 reducing injection of charge carriers to the support. In the case of a rectifier, buffer layer 2 is given a particular conductivity so as to maintain the reverse voltage and guarantee forward conduction.

Channel layer 3 is an important layer as it enables circulation of an electron gas which can be two-dimensional and determines the performances of the component due to its electron transport properties.

The role of barrier layer 4 is to provide the structure with free electrons—it is the donor layer.

Ohmic contact electrode 5 enables carriers to be injected or recovered. In the case of a transistor, there are two ohmic contact electrodes—source 5 is the electrode that injects carriers into the structure, whereas drain 6 is the electrode which recovers the carriers. In the case of a rectifier, there is only one ohmic contact electrode 5. Ohmic contact electrode 5 is formed by a superposition of metallic layers deposited on superficial layer 7 or on the top surface of barrier layer 4 which in this case ensures a better ohmic contact.

Barrier layer 4 can be covered by a superficial layer 7 which prevents the structure from being damaged and contributes to ensuring a good Schottky contact with Schottky contact electrode 8 that is deposited there-above.

Lastly a passivation layer 9 encapsulates the device. In a general manner, passivation protects the surface of the semiconductor.

To optimize the performances of electronic devices of this type, it is generally sought to improve the access resistance of the ohmic contact electrode. This resistance is directly linked to the resistivity of the superposition of metallic layers deposited to form the electrode and to the resistivity of the junction between this superposition of metallic layers and the semiconducting material of the device.

It is therefore sought to optimize the contact between the metallic ohmic contact electrode and the semi-conducting material of the device, called ohmic contact, to obtain a reduced contact resistance, preferably lower than 1 $\Omega\cdot$mm. This contact resistance is the resistance of the material to the electric current flow and is measured using the Transmission Line Method (TLM). This method is described in detail in chapter III ("Contact resistance Schottky barrier and electromigration") in the book "Semi-conductor material device characterization" by Dieter K. Schroder published by Wiley Publications.

To optimize the ohmic contacts, several methods are already known from the state of the art.

In the case where the ohmic contact electrodes are deposited on the superficial layer, the conductivity of the latter can be increased by doping. For example, if the superficial layer is made of GaN, doping is performed with n-type carriers such as Silicon and Germanium. But this type of doping modifies the electrical properties of the whole of the structure transforming its band energy diagram.

Another method consists in etching the superficial layer and the barrier layer until the channel layer is reached and in making a contact called "lateral contact" between the ohmic contact electrode and channel layer. But etching is tricky to perform as it may generate defects on the etching sides which will minimize the performances of the component (surface leakage current, reduction of breakdown voltage).

Implanting silicon in the barrier layer increases its conductivity with a contact resistance of 0.4 $\Omega\cdot$mm when the silicon content in the barrier layer reaches $10^{19}$ atoms per cm$^3$ (reference can in this respect be made to the publication by S. Denbaars et al. in IEE vol. 26 N° 5 May 2005). However, to activate silicon by reorganization of the crystalline structure after implantation, very high temperature annealing is required (1500° C. under 100 bars of $N_2$), and this type of method is difficult to apply on an industrial scale.

It is also possible to deposit a Titanium/Aluminium contact on the barrier layer and then perform annealing at 950° C. At this temperature, the metal diffuses in the barrier layer until it reaches the channel layer in which the electron gas is circulating and fosters a good ohmic contact. But this method comprises two drawbacks which are at the origin of leakage currents reducing the efficiency of the device: firstly the superficial layer has to be eliminated, and secondly the annealing temperature corresponds to that of formation of the material so that its surface is damaged during annealing. Deposition of an encapsulation layer (for example of AlN or $Si_3N_4$) to protect the surface during annealing is often necessary.

Finally, increasing the aluminium content from 20 to 30% in the AlGaN barrier layer considerably improves the conductivity of the layer, but the AlGaN alloy can thereby lose its homogeneity and become unstable. The strain stored in the AlGaN layer is in fact the greater the higher the aluminium content, and relaxation of this strain is moreover frequently observed by premature aging of the devices. Moreover, too high an aluminium content in the barrier layer results in an increase of gate leakage currents. Embodiments disclosed herein address these issues.

SUMMARY OF THE DISCLOSURE

Advantages of the present invention will be set forth in and become apparent from the description that follows. Additional advantages of the invention will be realized and attained by the methods and systems particularly pointed out in the written description and claims hereof, as well as from the appended drawings.

One of the objects of the invention is to propose a method that does not involve the drawbacks mentioned above by improving the conductivity between the ohmic contact electrode(s) and channel without degrading the structure of the electronic device, this being achieved under conditions that are easy to implement on an industrial scale. Another object of the invention is to form ohmic contacts contributing to improving the reliability and lifetime of the electronic device.

In general, the ohmic contact is created by alloying of the superposed metallic layers which form the ohmic contact electrodes with the semi-conducting material of the electronic device, this material being formed by a binary, ternary or quaternary alloy of group III/N elements, such as for example GaN, AlGaN, AlInN, InGaN, InN, AlN or AlGaInN or any other composite in addition containing boron.

Formation of the alloy does in fact enable the band diagram under the contact to be modified. The height of the barrier for passage of electrons is thereby reduced.

Embodiments of the invention can therefore implement implantation in a barrier layer, under the ohmic contact electrode(s), of at least one metal selected from the metals forming the superposed deposited layers to form said electrode(s), followed by local alloying between the barrier layer and the first layer of the electrode, this alloying being enhanced by the presence of the implanted metal.

In a first embodiment, an electronic device is provided successively comprising from its base to its surface a support layer, a channel layer to contain an electron gas, a barrier layer, at least one ohmic contact electrode formed by a superposition of metallic layers a first layer of which is in contact with the barrier layer, the barrier layer presenting a region called the contact region, under the ohmic contact electrode (s), comprising at least one metal selected from the metals forming part of said superposition of metallic layers.

According to further aspects of this embodiment, the channel layer can be on a buffer layer. The device can further include a superficial layer on the barrier layer. If desired, the device can further include at least one Schottky contact electrode. The contact region can be situated exclusively under the ohmic contact electrode, and the contact region can extend throughout the whole thickness of the barrier layer and in the channel layer. Materials implanted into the contact region can include aluminium, titanium, molybdenum, tungsten, ruthenium and/or tantalum, as well as silicon. Preferably, the contact region presents an implanted metal content or a metal and silicon content comprised between $10^{19}$ and $10^{21}$ atoms per cm$^3$. The contact region can present a maximum metal content on its top surface. In one embodiment, the barrier layer can include at least one group III material and nitrogen. The channel layer can include at least one group III material and nitrogen. In another embodiment, the barrier layer can be thinner under the ohmic contact electrode than in the rest of the device.

In accordance with a further embodiment, an electronic device is provided successively comprising from its base to its surface a support layer, a channel layer to contain an electron gas, a barrier layer, at least one ohmic contact electrode formed by a superposition of metallic layers a first layer of which is in contact with the barrier layer, the barrier layer presenting a region called the contact region, under the ohmic contact electrode(s), comprising at least one metal selected from the metals forming part of said superposition of metallic layers, and local alloying binding the contact region and the first layer of the electrode.

According to further aspects of this embodiment, the channel layer can be on a buffer layer. The device can further include a superficial layer on the barrier layer. If desired, the device can further include at least one Schottky contact electrode. The contact region can be situated exclusively under the ohmic contact electrode, and the contact region can extend throughout the whole thickness of the barrier layer and in the channel layer. The contact region can include implanted aluminium, titanium, molybdenum, tungsten, ruthenium and/or tantalum, as well as silicon. Preferably, the contact region presents an implanted metal content or a metal and silicon content comprised between $10^{19}$ and $10^{21}$ atoms per cm$^3$. In one embodiment, the barrier layer can include at least one group III material and nitrogen. The channel layer can include at least one group III material and nitrogen. In another embodiment, the barrier layer can be thinner under the ohmic contact electrode than in the rest of the device.

In accordance with still a further embodiment, an electronic device is provided successively comprising from its base to its surface a support layer, a channel layer to contain an electron gas, a barrier layer, at least one ohmic contact electrode formed by a metal alloy, the barrier layer presenting a region called the contact region, under the ohmic contact electrode(s), comprising at least one metal selected from the metals forming part of said alloy, and total alloying binding the contact region and the whole of the ohmic contact electrode.

According to further aspects of this embodiment, the channel layer can be on a buffer layer. The device can further include a superficial layer on the barrier layer. If desired, the device can further include at least one Schottky contact electrode. The contact region can be situated exclusively under the ohmic contact electrode, and the contact region can extend throughout the whole thickness of the barrier layer and in the channel layer. The contact region can include implanted aluminium, titanium, molybdenum, tungsten, ruthenium and/or tantalum, as well as silicon. Preferably, the contact region presents an implanted metal content or a metal and silicon content comprised between $10^{19}$ and $10^{21}$ atoms per cm$^3$. In one embodiment, the barrier layer can include at least one group III material and nitrogen. The channel layer can include at least one group III material and nitrogen. In another embodiment, the barrier layer can be thinner under the ohmic contact electrode than in the rest of the device.

Furthermore, in another embodiment, an exemplary fabrication method is provided for making an electronic device. The method includes formation of a structure including a support layer, a channel layer to contain an electron gas, and a barrier layer. The method further includes formation of at least one ohmic contact electrode by deposition of a superposition of metallic layers, wherein a first layer of the superposition of layers is in contact with the barrier layer. Prior to forming the ohmic contact electrode, the method also includes creating a contact region in the barrier layer under the ohmic contact electrode, wherein the contact region includes a metal selected from the metals forming part of the superposition of metallic layers. In addition, the method preferably includes annealing the structure at a temperature enabling at least local alloying between the material of the contact region and the material of the first layer of the electrode.

In further accordance with the aforementioned method, at least one metal selected from the metals forming part of the superposition of metallic layers can be implanted in the barrier layer. The implanted metal can be, for example, aluminium, titanium, molybdenum, tungsten, ruthenium and/or tantalum. If desired, silicon can be implanted in the barrier layer as well. The implanted metal content or the metal and silicon content preferably includes between $10^{19}$ and $10^{21}$ atoms per cm$^3$. If desired, the aforementioned annealing step can be carried out at a temperature between 650° C. and 1050° C., or at a temperature lower than 750° C. During this annealing step, annealing of the structure can be performed at a temperature permitting complete or substantially complete alloying of the metals forming the superposition of metallic layers and of the contact region. In one embodiment, an annealing step is performed after implantation and prior to deposition of the superposition of layers at a temperature between 700° C. and 800° C. in a NH$_3$ atmosphere. In one embodiment, a protective layer can be formed on the structure after the initial formation step of the support layer, channel layer and barrier layer, but before the aforementioned implantation step. In accordance with another embodiment, annealing can be performed after the initial formation step of the support layer, channel layer and barrier layer, but before the aforementioned implantation step at a temperature between 800° C. and 1050° C.

It is to be understood that the foregoing general description and the following detailed description are exemplary and are intended to provide further explanation of the invention claimed. The accompanying drawings, which are incorporated in and constitute part of this specification, are included to illustrate and provide a further understanding of the method and system of the invention. Together with the description, the drawings serve to explain principles of the invention.

DETAILED DESCRIPTION OF THE INVENTION

Reference will now be made in detail to the present preferred embodiments of the invention, examples of which are illustrated in the accompanying drawings. The methods and corresponding steps provided herein will be described in conjunction with the detailed description of the disclosed structures.

The figures illustrate a particular exemplary embodiment of the invention relating to a field effect transistor of HEMT type, but the description that follows applies in a more general manner to an electronic device including at least one ohmic contact electrode, such as a rectifier for example. For this purpose, the left-hand part of the figures will be described in detail, the right-hand part with a second ohmic contact electrode 6 being described in similar manner.

Figure 1:
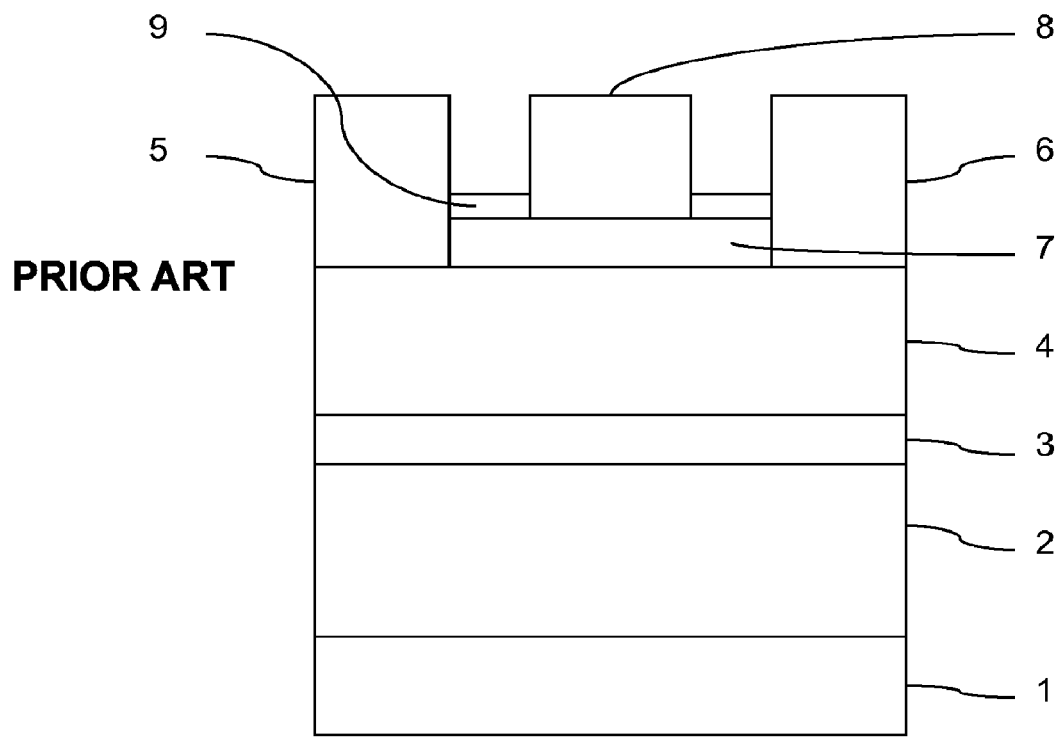
FIG. 1 represents a HEMT of known type.
Figure 2:
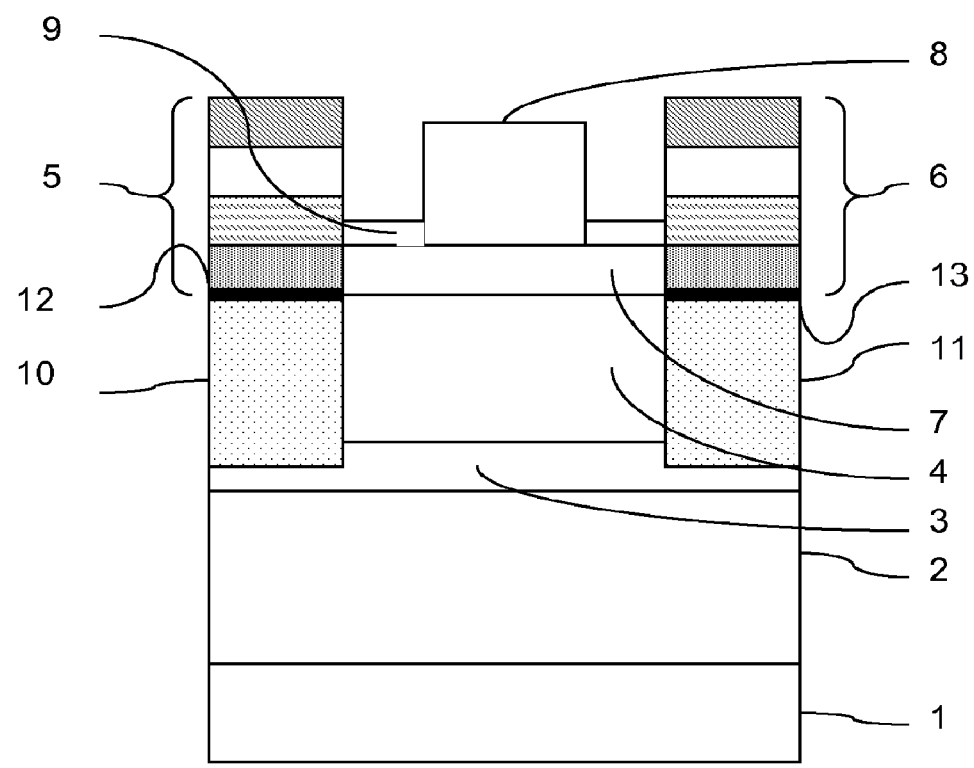
FIG. 2 represents an exemplary structure of a HEMT according to an embodiment of the invention.

With reference to FIG. 2, a device according to the invention successively comprises from its base to its surface a support layer 1, an optional buffer layer 2, a channel layer 3 where an electron gas is able to circulate, a barrier layer 4, an optional superficial layer 7, at least one ohmic contact electrode 5 and a Schottky contact electrode 8.

Support layer 1 is made from a material which may be semiconducting or not, such as for example Si, SiC, GaN, Al$_2$O$_3$, AlN.

Buffer layer 2 is formed by a binary, ternary or quaternary alloy of group III/N elements, such as for example GaN.

Channel layer 3 is made from a gallium-based group III/N material which can be a binary, ternary or quaternary alloy, such as GaN, BGaN, AlGaN or another.

Barrier layer 4 comprises a material formed by a binary, ternary or quaternary alloy of group III/N elements. The choice of the materials of the barrier layer and of the channel layer is free in so far as the channel layer material always presents a smaller bandgap than that of the barrier layer material.

Superficial layer 7 is made of GaN.

Ohmic contact electrode 5 is formed by a superposition of metallic layers, for example of Ti/Al/Ti/Au or Ti/Al/Ni/Au type, but molybdenum (Mo), tungsten (W), ruthenium (Ru), and tantalum (Ta) can also be used. According to an alternative embodiment, the ohmic contact electrode is formed by alloying of said metals.

To ensure a good ohmic contact, the first layer of ohmic contact electrode 5 is in contact with barrier layer 4, whereas Schottky contact electrode is in contact with superficial layer 7.

According to a first embodiment, barrier layer 4 comprises a region called contact region 10, under ohmic contact electrode 5. This contact region 10 extends throughout the whole thickness of barrier layer 4 and also in the channel layer. Contact region 10 is situated exclusively under the ohmic contact electrode, i.e. it is bounded in a horizontal plane by the projection in a vertical direction of the perimeter of the first layer of ohmic contact electrode 5 (said horizontal plane being, according to the figures, the plane parallel to the surface of the device, said vertical direction being perpendicular to the surface of the device). Said contact region 10 comprises the material of the layer in which it extends and a metal forming part of the superposed metallic layers constituting the ohmic contact electrode. The content of said metal is advantageously comprised between $10^{19}$ and $10^{21}$ atoms per cm$^3$.

Moreover, at the interface with ohmic contact electrode 5, alloying called local alloying 12 exists binding contact region 10 and the first layer of ohmic contact electrode 5 in contact with the barrier layer. Alloying 12 is situated at the interface between the barrier layer and ohmic contact electrode 5 and is formed by the material of the first layer of the electrode, of the barrier layer material and of the metal.

The ohmic contact formed by this local alloying is qualified as "non alloyed" as the metallic layers constituting ohmic contact electrode 5 are not alloyed with one another. Local alloying at the interface between the first layer of the electrode and the barrier layer presents the advantage of providing contact adhesion, which contributes to reducing the access resistances. Moreover, it has been observed that a non-alloyed ohmic contact of this type increases the reliability and lifetime of the device, resulting in a very high mean time between failure (MTBF) of some several million hours of operation.

Figure 5:
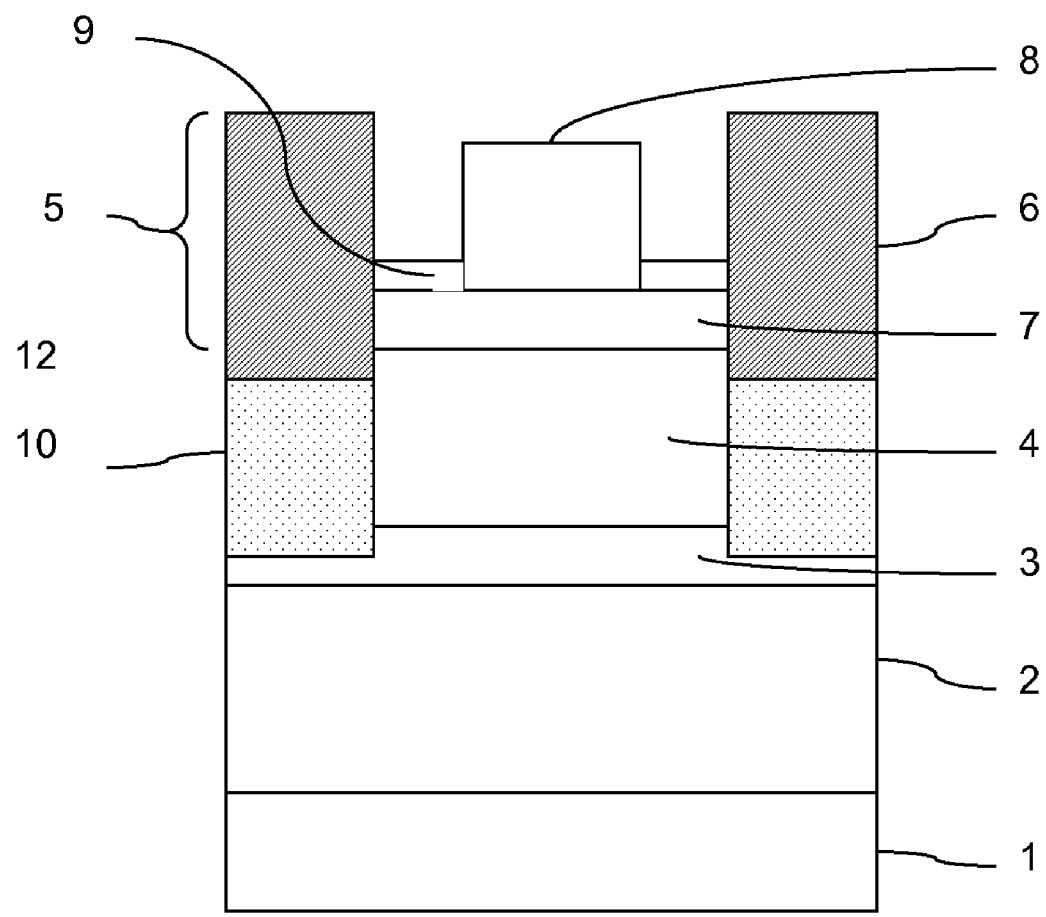
FIG. 5 represents an alternative embodiment of a HEMT according to the invention.

According to an alternative embodiment represented in FIG. 5, ohmic contact electrode 5 is formed by a single alloying which comprises all of the metallic layers and also the interface between the ohmic contact electrode and the contact region 10. This alloying is then qualified as "total alloying", for all of the metallic layers of the electrode are alloyed. It should be noted that total alloying only comprises the top part of contact region 10, the bottom part of contact region 10 being formed by the material of the layer in which it extends and by a metal forming part of the alloying forming the ohmic contact electrode.

An intermediate structure enabling an electronic device according to the invention to be obtained will now be described.

Figure 3A:
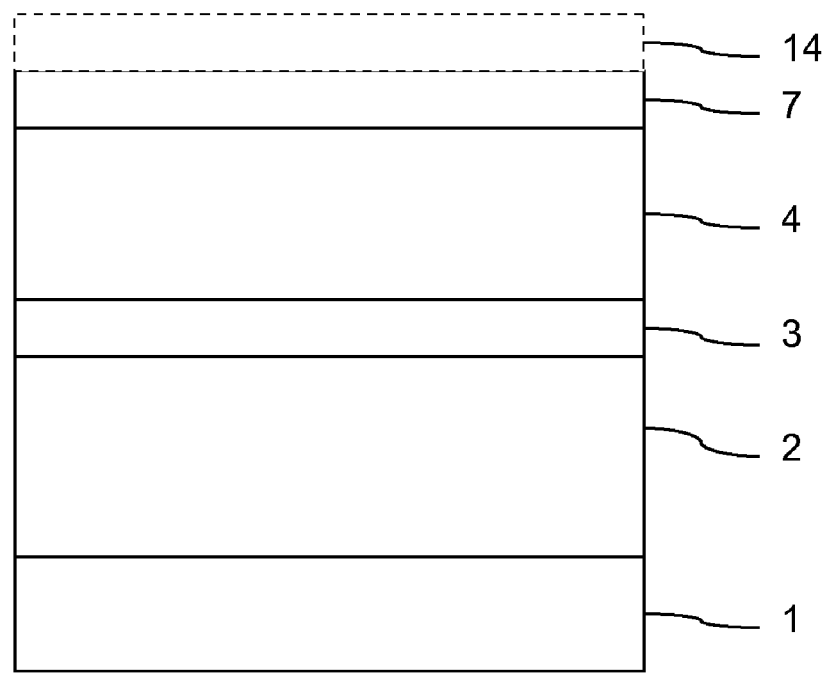
FIGS. 3a to 3c represent exemplary fabrication steps of a HEMT according to an embodiment of the invention.
Figure 3B:
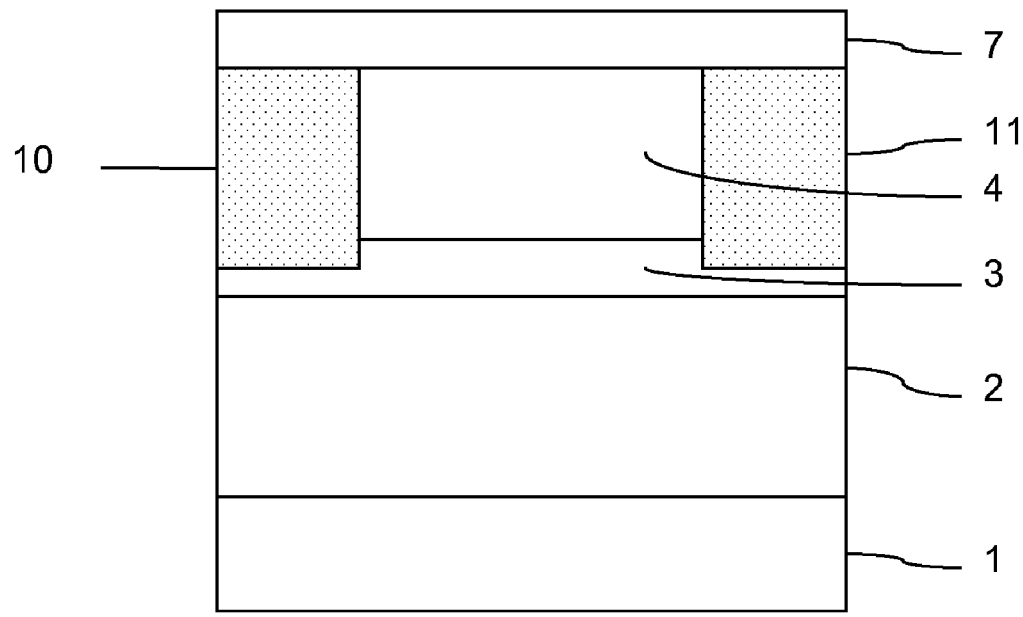
Figure 3C:
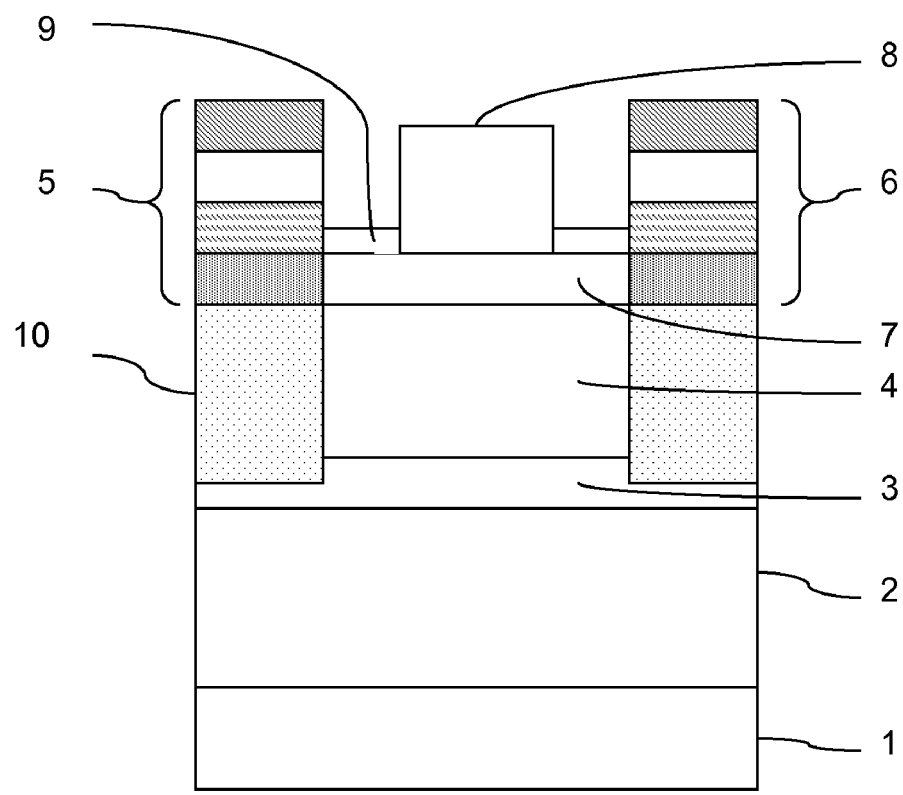

With reference to FIG. 3c, said intermediate structure successively comprises from its base to its surface a support layer 1, a buffer layer 2, a channel layer 3 to contain an electron gas, a barrier layer 4, at least one ohmic contact electrode 5 in contact with said barrier layer 4, a superficial layer 7 and a gate electrode 8 in contact with superficial layer 7.

Barrier layer 4 comprises a region called contact region 10 extending throughout the thickness of barrier layer 4 and in channel layer 3, under ohmic contact electrode 5.

Contact region 10 comprises the material of the layer in which it extends and a metal from which ohmic contact electrode 5 is made. Preferably said metal is aluminium or titanium. The density of metal in the contact region is not uniform: it is distributed over the thickness of the barrier layer with a Gaussian profile with a higher metal content at the top surface of barrier layer 4.

Figure 4A:
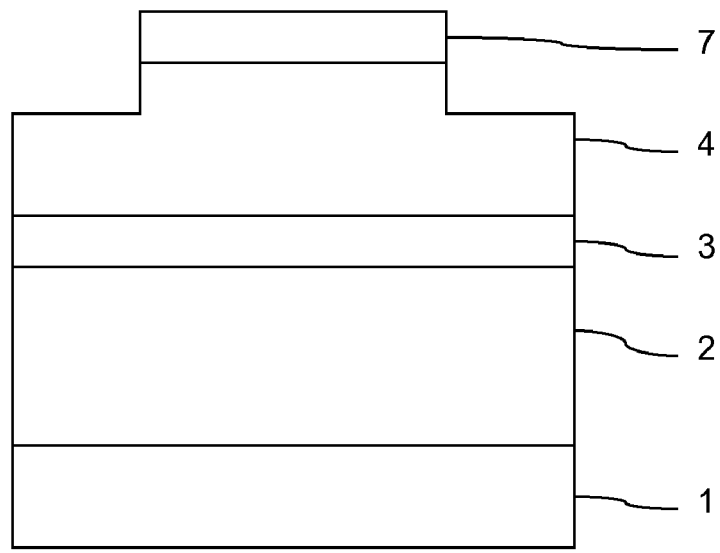
FIGS. 4a to 4c represent the fabrication steps of a HEMT according to another embodiment of the invention.
Figure 4B:
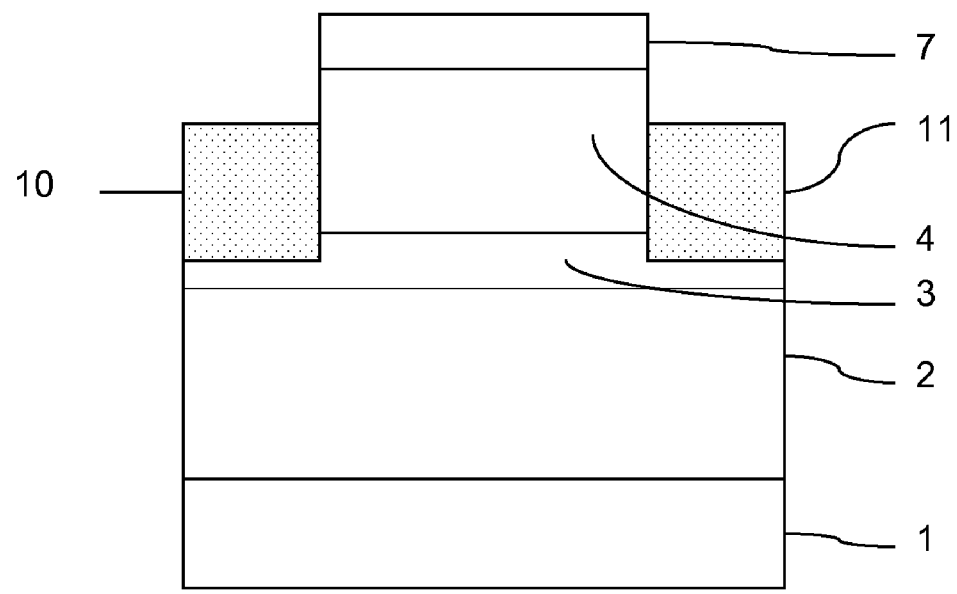
Figure 4C:
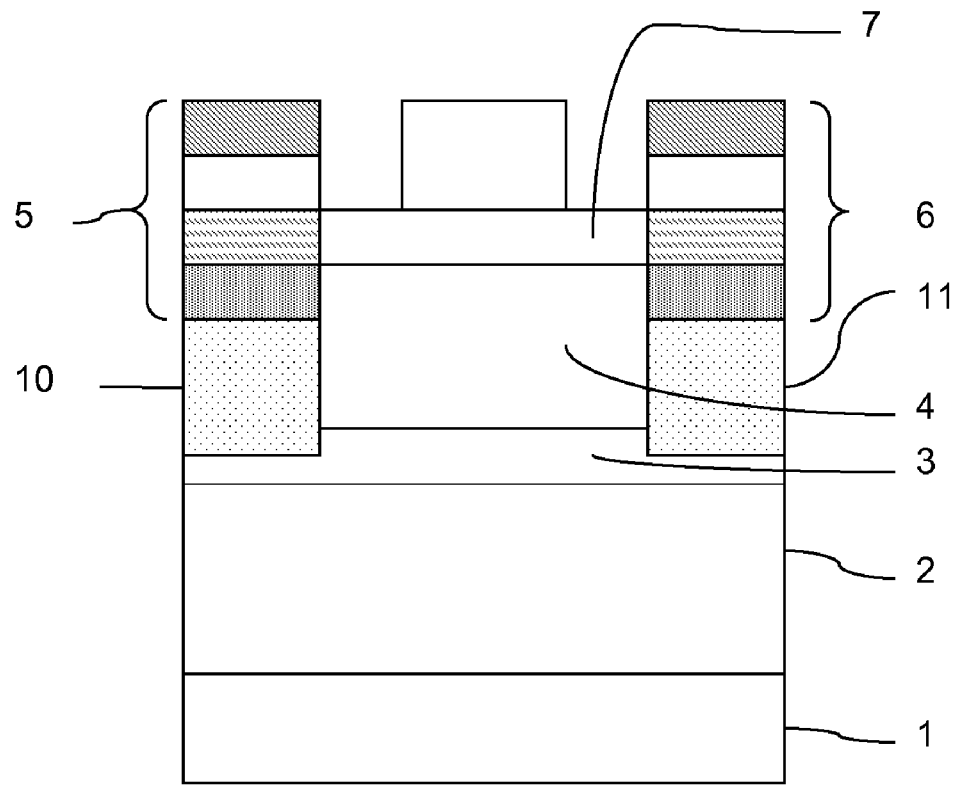

According to an alternative embodiment, with reference to FIG. 4c, barrier layer 4 is thinner under ohmic contact electrode 5 than in the rest of the device.

According to a particular embodiment, contact region 10 further comprises silicon.

A fabrication method of an electronic device according to the invention will now be described.

A first step comprises formation of an intermediate structure of the type as represented in FIG. 3c or 4c described above.

Different methods of formation of the intermediate structure will first be described in detail.

With reference to FIG. 3a, a structure comprising layers 1, 2, 3, 4 and 7 is produced by a technique known to the person skilled in the trade, such as MBE or MOCVD for example. This structure can optionally be covered by an encapsulation layer 14.

According to a first embodiment, a mask is deposited on the surface of this structure so as to only leave the location of the ohmic contact electrode free, then implantation of a metal is performed in the barrier layer, through superficial layer 7, this metal forming part of the superposition of metallic layers constituting ohmic contact electrode 5.

The person skilled in the trade adjusts the implantation dose and energy parameters according to the nature of the materials and of the mask used so that the implanted metal content is highest on the top surface of the barrier layer. However, the thicknesses of the layers of the structure are so thin that a small quantity of metal will also be implanted in channel layer 3.

As can be seen in FIG. 3b, a contact region 10 has thus been formed under ohmic contact electrode 5, which region extends throughout the whole thickness of barrier layer 4 and on at least a part of the thickness of channel layer 3.

It should be noted that implantation disorganizes the crystal lattice of the material in which the metal was implanted. The implantation step must therefore be followed by annealing enabling reorganization of the material and diffusion of the implanted metal in the barrier layer. Said annealing will be described in detail further on.

In a second embodiment, with reference to FIGS. 4a and 4b, superficial layer 7 and a part of barrier layer 4 are etched at the scheduled location of the ohmic contact electrode. Implantation of a metal can thereby be performed as described above, but with a smaller dose and weaker energy. The smaller thickness of the barrier layer does in fact enable a lower energy to be used and a good ohmic contact to be obtained with a smaller implanted metal dose.

This lower-dosed implantation presents the advantage of involving a less costly process as it is less lengthy. The implanted zone is in fact less damaged and thinner than in the first embodiment and is therefore easier to reorganize. Moreover, diffusion of the implanted metal in the barrier layer takes place more easily and requires annealing at a less high temperature.

According to a particular embodiment, it is also possible to perform co-implantation of a metal comprised in the stack of layers forming the ohmic contact electrode and of silicon, with a silicon dose of about $10^{17}$ to $5 \cdot 10^{19}$ atoms per $cm^3$. A dose of $10^{17}$ atoms per $cm^3$ is in fact the minimum silicon dose to be implanted to obtain n-type conductivity in the barrier, and implantation beyond $5 \cdot 10^{19}$ atoms per $cm^3$ leads to the material being damaged. Silicon has a doping effect enabling the height of the barrier to be lowered thereby reducing the access resistances of the device even further. In a particular embodiment, the silicon is not implanted but can also be deposited during growth of the material forming barrier layer 4.

In similar manner, co-implantation of two of the metals forming part of the superposition of metallic layers of ohmic contact electrode 5 can enable a particular profile of the different metals to be obtained in the semi-conductor and can participate in optimizing the access resistances.

The second main fabrication step of the electronic device, comprising annealing of the intermediate structure, can be performed according to several alternative embodiments which will be described hereafter.

According to a first alternative embodiment, annealing is performed in a single step taking place after formation of the ohmic contact electrode by deposition of the superposed metallic layers on the barrier layer after the superficial layer has been etched at this location. The conditions of this annealing are: a temperature comprised between 750 and 1050° C., an annealing time of 20 seconds to 30 minutes, in a neutral gas atmosphere. Such an annealing results in reorganization of the material, diffusion of the implanted metal in the thickness of barrier layer 4 up to channel layer 3, and total alloying of the metallic layers constituting ohmic contact electrode 5 with the top part of contact region 10. The device obtained is represented in FIG. 5.

It should be noted that the higher the annealing temperature, the more the alloy that forms at the level of the metallic layers of the ohmic contact electrode seems to be inhomogeneous with phase separation zones and therefore does not present a good mechanical strength over a long duration, which contributes to reducing the efficiency of the device over time.

According to a preferred second alternative embodiment, annealing is performed in two steps.

A first annealing is performed on the structure after implantation. This annealing at a temperature comprised between 700 and 800° C. is performed for 20 seconds to 30 minutes in a $NH_3$ atmosphere to reorganize the material of the barrier layer that was damaged during implantation. $NH_3$ does in fact present the advantage of stabilizing the surface better than $N_2$ as it dissociates at low temperature (as from 500° C.) and generates active species which prevent evaporation of nitrogen from the GaN superficial layer during heating to 800° C. and therefore damage of the superficial layer. Using a $NH_3$ atmosphere therefore enables formation of an encapsulating protective layer to be prevented.

If an encapsulating protective layer 14, for example of $SiO_2$, was formed on the structure, this annealing can be performed at a higher temperature, preferably less than 1050° C., until the stability threshold of the material forming encapsulating layer 14 is reached without damaging the surface of the material forming the superficial layer. Use of a $SiO_2$ encapsulating layer is particularly suitable for co-implantation of metal and silicon. A temperature of 1050° C. can in fact be reached in a $NH_3$ or neutral gas atmosphere, enabling the silicon to be activated in the crystalline structure before deposition of the electrodes. These activation conditions are advantageously easier to implement than those described by Denbaars where a pressure of 100 bars under $N_2$ at 1500° C. is required. Encapsulation layer 14 is then etched but the superficial layer does not have to be etched to achieve ohmic contacts by direct deposition of the electrodes.

After this first annealing, encapsulating protective layer 14 if present, is removed and etching of superficial layer 7 is performed at the location of ohmic contact electrode 5 so as to be able to deposit the first metallic layer of this electrode in contact with barrier layer 4.

After formation of ohmic contact electrode 5, a second annealing is performed at a temperature called low temperature, i.e. lower than 750° C. and preferably lower than 650° C., in a neutral gas such as $N_2$, $H_2$, $Ar_2$ or any mixture of these gases, for 30 seconds to 30 minutes. The temperature of this annealing is too low to enable alloying of the metallic layers forming the electrodes. It is however sufficient to form local alloying 12 at the interface between the first layer of ohmic contact electrode 5 with contact region 10. This local alloying guarantees adhesion of the contact and contributes to reducing the access resistances.

This second annealing embodiment therefore enables the behavior of the device to be stabilized by stabilizing the contact properties of the electrode, even if the temperature is not high enough to perform alloying of the metals of the superposed layers constituting the ohmic contact electrode. The ohmic contact thus formed is said to be "non alloyed". Furthermore, it has been observed that a non alloyed ohmic contact of this type increases the reliability and lifetime of the device, which results in a very high mean time before failure (MTBF) of some several million hours of operation.

A third alternative embodiment of annealing consists in only performing the second low-temperature annealing of the second alternative embodiment described above, which also leads to formation of a non alloyed ohmic contact.

The technique of metal implantation before forming electrodes has the advantage that the subsequent thermal treatment will be sufficiently low to avoid damaging III/N materials of the structure and to not lead to inhomogeneous ohmic contacts. Indeed, the metals constituting the electrodes have very weak diffusion coefficients in III/N materials, thus the thermal budget (temperature/duration) necessary for diffusion, that is known in the prior art methods for forming the contacts, is so high that it does not allow the formation of non alloyed electrodes or local alloyed electrodes. Moreover, this high thermal budget leads to the degradation materials and to the reduced reliability and lifetime of the electronic devices due to inhomogeneous contacts.

In a general manner, annealing according to the invention gives the opportunity of stabilizing the subsequent performances of the structure as its temperature is higher than that which will be produced in the material during use. The structure will evolve rapidly to reach its final performances at the annealing temperature (for example by desorption of contaminants) and will subsequently present operation with a very great stability of performance as is desired.

Three embodiments of the invention will now be described applied to fabrication of a HEMT presenting improved ohmic contacts.

Example 1

A structure successively comprising a semi-conductor layer 1, a buffer layer 2, a channel layer 3 to contain an electron gas, a barrier layer 4 and a superficial layer 7 is first of all formed by a known technique such as MBE or MOCVD.

The barrier layer is made of AlGaN and presents an aluminium content comprised between 10 and 25%.

Implantation of aluminium at high dose is then performed in barrier layer 4 so as to achieve an aluminium content of more than $10^{19}$ atoms per $cm^3$ at the level of the surface of barrier layer 4 in the lattice of the material. The implanted metal content can be up to $10^{21}$ atoms per $cm^3$.

Annealing according to the second alternative embodiment described above is then performed. For this purpose, the structure thus obtained is subjected to a temperature of 700° C. for 30 minutes in a $NH_3$:$N_2$ atmosphere (respectively in proportions ⅓:⅔).

Etching of the superficial layer is then performed at the location scheduled for the drain and source according to a known technique, and the electrodes are then deposited: the first layer of source electrode 5 and drain electrode 6 is deposited in contact with barrier layer 4. A second annealing is then performed at a temperature of 650° C. for 30 seconds to 60 minutes.

The passivation layer and gate 8 are then formed.

The ohmic contact obtained in this example is about 0.15 to 0.5 Ω·mm.

Example 2

A structure successively comprising a semi-conductor layer 1, a buffer layer 2, a channel layer 3 to contain an electron gas, a barrier layer 4 and a superficial layer 7 is first of all formed by a known technique such as MBE or MOCVD.

The barrier layer is made of AlGaN and presents an aluminium content comprised between 10 and 25%.

Etching of the thickness of superficial layer 7 and of one third of barrier layer 4 is then performed at the location of source 5 and drain 6. For this, techniques known to the person skilled in the trade are used, such as formation of a mask followed by performing dry etching or wet method etching, for example KOH-based activated by UV.

Aluminium is then implanted at reduced dose so as to obtain an implantation profile with a maximum at the surface of barrier layer 4. The implanted aluminium content varies from $10^{19}$ to $10^{21}$ atoms per $cm^3$.

Formation of the electrodes is then performed in the same way as in example 1.

The resulting structure then undergoes annealing at a temperature comprised between 750 and 1050° C. for 20 seconds to 30 minutes in a neutral gas atmosphere.

Lastly, the passivation layer and gate 8 are formed.

In this example, the ohmic contact obtained is about 0.5 Ω·mm.

Example 3

A structure successively comprising a semi-conductor layer 1, a buffer layer 2, a channel layer 3 to contain an electron gas, a barrier layer 4 and a superficial layer 7 is first of all formed by a known technique such as MBE or MOCVD.

The barrier layer is made of AlGaN and presents an aluminium content comprised between 10 and 25%.

An encapsulating protective layer 14 made from a material such as $SiO_2$ or $Si_3N_4$ for example is then formed on this structure.

Co-implantation of aluminium and silicon is then performed so as to reach an aluminium content of more than $10^{19}$ atoms per $cm^3$ at the level of the surface of barrier layer 4 in the material lattice. The implanted aluminium+silicon content can be up to $10^{21}$ atoms per $cm^3$.

Annealing of this structure is then performed at a temperature of 1050° C. for 30 minutes in a $N_2$ atmosphere, the surface being protected by the encapsulating layer used for implantation.

Encapsulating protective layer 14 is then removed by any suitable means available to the person skilled in the trade.

A passivation layer of $Si_3N_4$ is deposited.

The drain and source electrodes are deposited in the form of a superposition of Ti/Al/Ti/Au or Ti/Al/Ni/Au layers.

Finally, a second annealing is performed at a temperature of 650° C. for 30 seconds to 30 minutes to form the non alloyed ohmic contacts. In this example, the ohmic contact obtained is about 0.15 to 0.5 Ω·mm.

The methods and systems of the present invention, as described above and shown in the drawings, provide superior approaches of forming electronic devices with improved ohmic contact. It will be apparent to those skilled in the art that various modifications and variations can be made in the devices and methods of the present invention without departing from the spirit or scope of the invention. Thus, it is intended that the present invention include modifications and variations that are within the scope of the appended claims and their equivalents.

What is claimed is:

1. A method of making an electronic device, the method comprising the steps of:

forming a structure including a support layer, a channel layer adapted to contain an electron gas, and a barrier layer;

forming a contact region in the barrier layer;

forming at least one ohmic contact electrode over the contact region by depositing a superposition of metallic layers, a first layer of which is in contact with the portion of the barrier layer including the contact region, wherein the contact region includes at least one metal selected from the metals forming the superposition of metallic layers; and annealing the structure at a temperature sufficient to cause at least local alloying between the material of the contact region and the material of the first layer of the electrode;

wherein the contact region forming step includes implanting at least one metal selected from the metals forming the superposition of metallic layers in the barrier layer, wherein the metal content in the contact region is between $10^{19}$ and $10^{21}$ atoms per $cm^3$ after implantation.

2. The method of claim 1, wherein the metallic layers are not alloyed upon being deposited.

3. A method of making an electronic device, the method comprising the steps of:

forming a structure including a support layer, a channel layer adapted to contain an electron gas, and a barrier layer;

forming a contact region in the barrier layer;

forming at least one ohmic contact electrode over the contact region by depositing a superposition of metallic layers, a first layer of which is in contact with the portion of the barrier layer including the contact region, wherein the contact region includes at least one metal selected from the metals forming the superposition of metallic layers; and annealing the structure at a temperature sufficient to cause at least local alloying between the material of the contact region and the material of the first layer of the electrode;

implanting silicon during the contact region formation step, wherein the implanted metal and silicon content in the contact region is between $10^{19}$ and $10^{21}$ atoms per $cm^3$ after implantation.

4. A method of making an electronic device, the method comprising the steps of:

forming a structure including a support layer, a channel layer adapted to contain an electron gas, and a barrier layer;

forming a contact region in the barrier layer;

performing an annealing step at a temperature between 700° C. and 800° C. in a $NH_3$ atmosphere;

forming at least one ohmic contact electrode over the contact region by depositing a superposition of metallic layers, a first layer of which is in contact with the portion of the barrier layer including the contact region, wherein the contact region includes at least one metal selected from the metals forming the superposition of metallic layers; and annealing the structure at a temperature sufficient to cause at least local alloying between the material of the contact region and the material of the first layer of the electrode.

5. A method of making an electronic device, the method comprising the steps of:

forming a structure including a support layer, a channel layer adapted to contain an electron gas, and a barrier layer;

forming a protective layer on the structure;

forming a contact region in the barrier layer;

annealing the structure at a temperature between 800° C. and 1050° C. forming at least one ohmic contact electrode over the contact region by depositing a superposition of metallic layers, a first layer of which is in contact with the portion of the barrier layer including the contact region, wherein the contact region includes at least one metal selected from the metals forming the superposition of metallic layers; and annealing the structure at a temperature sufficient to cause at least local alloying between the material of the contact region and the material of the first layer of the electrode.

6. The method of claim 1, wherein the annealing temperature is less than 750° C.

7. The method of claim 1, wherein the annealing temperature is between 650° and 1050° C.

8. The method of claim 1, wherein the annealing step is performed at a temperature enabling total alloying of the metals forming said superposition of metallic layers and of the contact region.

9. A method of making an electronic device, the method comprising the steps of:

forming a structure including a support layer, a channel layer adapted to contain an electron gas, and a barrier layer;

forming a contact region in the barrier layer;

performing an annealing step at a temperature between 700° C. and 800° C. in a $NH_3$ atmosphere;

forming at least one ohmic contact electrode over the contact region by depositing a superposition of metallic layers, a first layer of which is in contact with the portion of the barrier layer including the contact region, wherein the contact region includes at least one metal selected from the metals forming the superposition of metallic layers; and annealing the structure at a temperature sufficient to cause at least local alloying between the material of the contact region and the material of the first layer of the electrode;

wherein the barrier layer and channel layer each include at least one material selected from group III, and nitrogen.

* * * * *